(12) United States Patent
Choi et al.

(10) Patent No.: US 8,383,458 B2
(45) Date of Patent: *Feb. 26, 2013

(54) INTEGRATED CIRCUIT PACKAGE SYSTEM EMPLOYING AN OFFSET STACKED CONFIGURATION AND METHOD FOR MANUFACTURING THEREOF

(75) Inventors: DaeSik Choi, Seoul (KR); BumJoon Hong, Seoul (KR); Sang-Ho Lee, Yeoju (KR); Jong-Woo Ha, Seoul (KR); Soo-San Park, Seoul (KR)

(73) Assignee: Stats Chippac Ltd., Singapore (SG)

( * ) Notice: Subject to any disclaimer, the term of this patent is extended or adjusted under 35 U.S.C. 154(b) by 0 days.

This patent is subject to a terminal disclaimer.

(21) Appl. No.: 12/974,265

(22) Filed: Dec. 21, 2010

(65) Prior Publication Data
US 2011/0084373 A1    Apr. 14, 2011

Related U.S. Application Data

(63) Continuation of application No. 12/201,896, filed on Aug. 29, 2008, now Pat. No. 7,872,340.

(60) Provisional application No. 60/969,600, filed on Aug. 31, 2007.

(51) Int. Cl.
*H01L 21/00* (2006.01)
*H01L 23/02* (2006.01)

(52) U.S. Cl. ........... 438/109; 257/686; 257/E25.006; 257/E25.013; 257/E21.614

(58) Field of Classification Search .......... 257/686, 257/685, 723, 777, E25.005, E25.006, E25.021, 257/E25.027, E23.085, E25.013, E25.614; 438/109, FOR. 368, FOR. 426

See application file for complete search history.

(56) References Cited

U.S. PATENT DOCUMENTS

| | | | |
|---|---|---|---|
| 5,784,261 A | 7/1998 | Pedder | |
| 6,201,266 B1 | 3/2001 | Ohuchi et al. | |
| 6,558,978 B1 | 5/2003 | McCormick | |
| 6,762,488 B2 | 7/2004 | Maeda et al. | |
| 6,849,942 B2 * | 2/2005 | Lin et al. | 257/712 |
| 6,894,398 B2 | 5/2005 | Pon | |
| 7,008,822 B2 | 3/2006 | Bolken et al. | |
| 7,053,476 B2 | 5/2006 | Karnezos | |
| 7,061,087 B2 | 6/2006 | Kim | |
| 7,132,753 B1 | 11/2006 | St. Amand et al. | |
| 7,227,252 B2 | 6/2007 | Bolken et al. | |
| 7,253,511 B2 | 8/2007 | Karnezos et al. | |
| 7,420,269 B2 | 9/2008 | Ha et al. | |
| 7,518,224 B2 | 4/2009 | Shim et al. | |
| 7,746,656 B2 | 6/2010 | Shim et al. | |
| 7,872,340 B2 * | 1/2011 | Choi et al. | 257/686 |
| 2005/0230801 A1 | 10/2005 | Kuroda et al. | |
| 2007/0001296 A1 | 1/2007 | Lee et al. | |
| 2007/0052082 A1 | 3/2007 | Lee et al. | |
| 2007/0108581 A1 | 5/2007 | Shim et al. | |
| 2008/0136007 A1 * | 6/2008 | Kim et al. | 257/686 |
| 2008/0157318 A1 | 7/2008 | Chow et al. | |

* cited by examiner

*Primary Examiner* — Jasmine Clark
(74) *Attorney, Agent, or Firm* — Ishimaru & Associates LLP; Mikio Ishimaru

(57) ABSTRACT

A method for manufacturing an integrated circuit package system includes: providing a base package including a first integrated circuit coupled to a base substrate by an electrical interconnect formed on one side; and mounting an offset package over the base package, the offset package electrically coupled to the base substrate via a system interconnect.

15 Claims, 8 Drawing Sheets

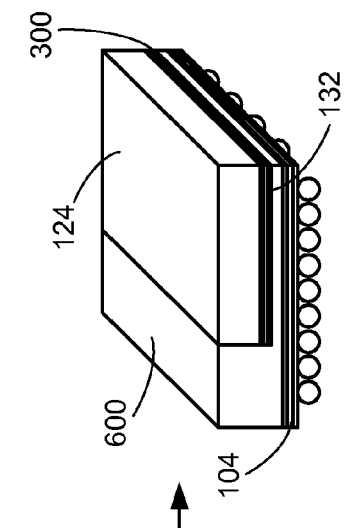
FIG. 14
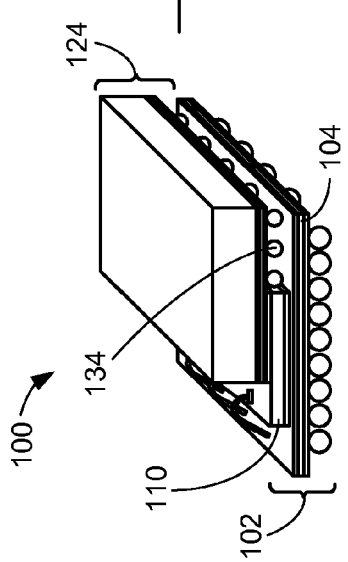
FIG. 16
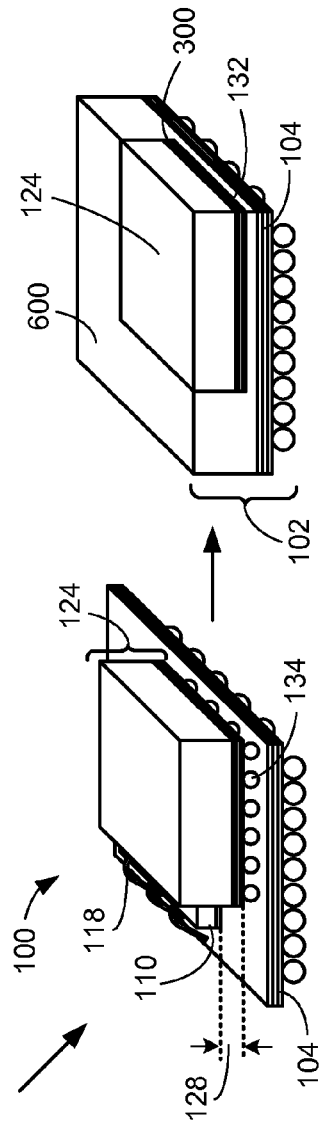
FIG. 13
FIG. 15
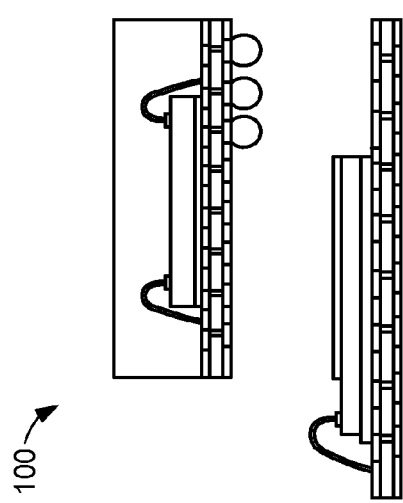
FIG. 12

INTEGRATED CIRCUIT PACKAGE SYSTEM EMPLOYING AN OFFSET STACKED CONFIGURATION AND METHOD FOR MANUFACTURING THEREOF

CROSS-REFERENCE TO RELATED APPLICATION(S)

This application is a continuation of U.S. patent application Ser. No. 12/201,896 filed Aug. 29, 2008, now U.S. Pat. No. 7,872,340, which claims the benefit of U.S. Provisional Patent Application Ser. No. 60/969,600 filed Aug. 31, 2007.

TECHNICAL FIELD

The present invention relates generally to integrated circuit package systems, and more particularly to a system for integrated circuit package systems employing an offset stacked configuration.

BACKGROUND ART

In order to interface an integrated circuit with other circuitry, it is common to mount it on a lead frame or substrate. Each integrated circuit has bonding pads that are individually connected to the lead frame's lead finger pads using extremely fine gold or aluminum wires. The assemblies are then packaged by individually encapsulating them in molded plastic or ceramic bodies to create an integrated circuit package.

Integrated circuit packaging technology has seen an increase in the number of integrated circuits mounted on a single circuit board or substrate. The new packaging designs are more compact in form factors, such as the physical size and shape of an integrated circuit, and provide a significant increase in overall integrated circuit density. However, integrated circuit density continues to be limited by the "real estate" available for mounting individual integrated circuits on a substrate and the size of the packages. Even larger form factor systems, such as PC's, computer servers, and storage servers, need more integrated circuits in the same or smaller "real estate". In particular, the need for portable personal electronics, such as cell phones, digital cameras, music players, PDA's, and location-based devices, has further driven the need for integrated circuit density.

This need for increased integrated circuit density, has led to the development of multi-integrated circuit (chip or die) packages in which more than one integrated circuit can be packaged. Each package provides mechanical support for the individual integrated circuits and one or more layers of interconnect lines that enable the integrated circuits to be connected electrically to surrounding circuitry. Current multi-integrated circuit (chip or die) packages, also commonly referred to as multi-integrated circuit (chip or die) modules, typically consist of a PCB substrate onto which a set of separate integrated circuit components is directly attached. Such multi-integrated circuit (chip or die) packages have been found to increase integrated circuit density and miniaturization, improve signal propagation speed, reduce overall integrated circuit size and weight, improve performance, and lower costs—all primary goals of the computer industry.

There is always a limitation on the number of die that can be stacked in a package, especially for big memory dies. Same die stacking with all bond pads located at one side allows stacking in the staircase manner, which can eliminate the need for thick spacers between the dies. However, die stacking is still restricted by the package size where overstacking causes die protrusions that require extra long packages.

Thus, a need still remains for a reliable and improved integrated circuit package system, method of fabrication, and design, wherein the integrated circuit package system exhibits a high level of functional integration, decreased package size, and ease of manufacturability. Moreover, in view of the shrinking size of consumer electronics and the demand for more sophisticated functions in the restricted space, it is increasingly critical that answers be found to these problems. Additionally, in view of the ever-increasing commercial competitive pressures, increasing consumer expectations, and diminishing opportunities for meaningful product differentiation in the marketplace, it is increasingly critical that answers be found to these problems. Furthermore, the ever-increasing need to save costs, improve efficiencies, and meet such competitive pressures adds even greater urgency to the critical necessity that answers be found to these problems.

Solutions to these problems have been long sought but prior developments have not taught or suggested any solutions and, thus, solutions to these problems have long eluded those skilled in the art.

DISCLOSURE OF THE INVENTION

The present invention provides a method for manufacturing an integrated circuit package system including: providing a base package including a first integrated circuit coupled to a base substrate by an electrical interconnection formed on one side; and mounting an offset package over the base package, the offset package electrically coupled to the base substrate via a system interconnect.

The present invention provides an integrated circuit package system including: a base package including a first integrated circuit coupled to a base substrate by an electrical interconnect on one side; and an offset package over the base package, the offset package electrically coupled to the base substrate via a system interconnect.

Certain embodiments of the invention have other aspects in addition to or in place of those mentioned above. The aspects will become apparent to those skilled in the art from a reading of the following detailed description when taken with reference to the accompanying drawings.

BRIEF DESCRIPTION OF THE DRAWINGS

FIG. 12 is a cross-sectional view of components for an integrated circuit package system in accordance with the third embodiment of the present invention depicted in FIG. 5;

FIG. 13 is an isometric view of an integrated circuit package system in accordance with an embodiment of the third embodiment of the present invention;

FIG. 14 is an isometric view of FIG. 13 after encapsulation;

FIG. 15 is an isometric view of an integrated circuit package system in accordance with an alternate embodiment of the third embodiment of the present invention;

FIG. 16 is an isometric view of FIG. 15 after encapsulation;

BEST MODE FOR CARRYING OUT THE INVENTION

Figure 1:
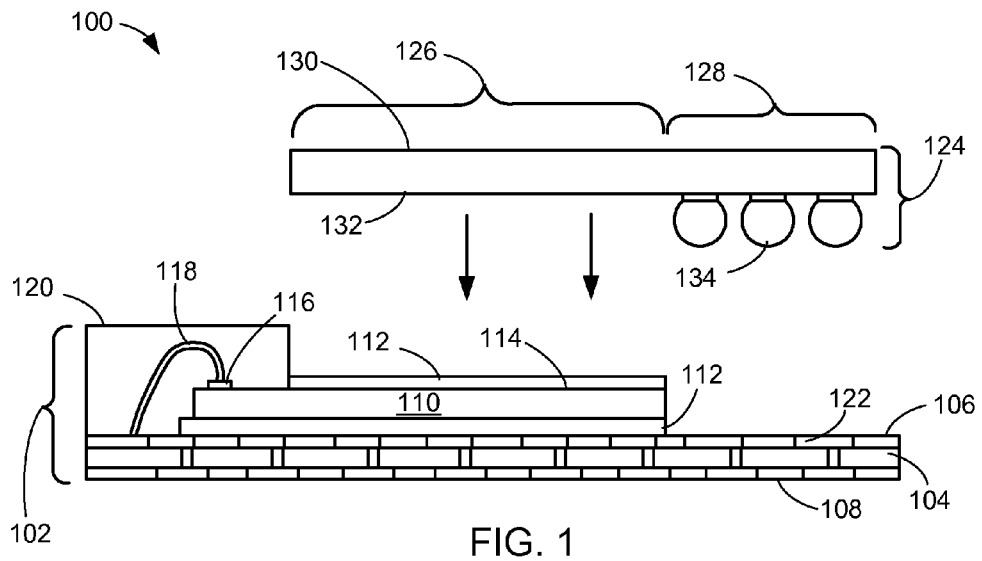
FIG. 1 is a cross-sectional view of components for an integrated circuit package system in a first embodiment of the present invention.

The following embodiments are described in sufficient detail to enable those skilled in the art to make and use the invention. It is to be understood that other embodiments would be evident based on the present disclosure, and that process or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

Likewise, the drawings showing embodiments of the device are semi-diagrammatic and not to scale and, particularly, some of the dimensions are for the clarity of presentation and are shown greatly exaggerated in the drawing FIGs. In addition, where multiple embodiments are disclosed and described having some features in common, for clarity and ease of illustration, description, and comprehension thereof, similar and like features one to another will ordinarily be described with like reference numerals.

The term "horizontal" as used herein is defined as a plane parallel to the plane or surface of the package substrate, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane.

The term "on" means there is direct contact among elements.

The term "processing" as used herein includes stamping, forging, patterning, exposure, development, etching, cleaning, and/or removal of the material or laser trimming as required in forming a described structure.

The terms "example" or "exemplary" are used herein to mean serving as an instance or illustration. Any aspect or embodiment described herein as an "example" or as "exemplary" is not necessarily to be construed as preferred or advantageous over other aspects or designs.

The terms "first" and "second" as used herein are for purposes of differentiation between elements only and are not to be construed as limiting the scope of the present invention.

The term "system" as used herein means and refers to the method and to the apparatus of the present invention in accordance with the context in which the term is used.

FIGS. 1-21, which follow, depict by way of example and not by limitation, exemplary embodiments for the formation of an integrated circuit package system and they are not to be construed as limiting. It is to be understood that a plurality of conventional processes that are well known within the art and not repeated herein, may precede or follow FIGS. 1-21. Moreover, it is to be understood that many modifications, additions, and/or omissions may be made to the below described processes and/or embodiments without departing from the scope of the claimed subject matter. For example, the below described processes and/or embodiments may include more, fewer, or other steps. Additionally, steps may be performed in any suitable order without departing from the scope of the present invention.

Moreover, it is to be appreciated that the integrated circuit package system of the present disclosure may include any number of stacked devices, such as but not limited to, memory devices, logic devices, analog devices, digital devices, or a combination thereof, for example. Moreover, it is to be understood that the integrated circuit package system manufactured by the embodiments described herein can be used within processor components, memory components, logic components, digital components, analog components, mixed-signal components, power components, radio-frequency (RF) components, digital signal processor components, micro-electromechanical components, optical sensor components, or a combination thereof, in numerous configurations and arrangements as may be needed.

Furthermore, it is to be understood that one or more of the integrated circuit package system could be prepared at one time on a medium, which could be separated into individual or multiple integrated circuit package assemblies at a later stage of fabrication.

Referring now to FIG. 1, therein is shown a cross-sectional view of components for an integrated circuit package system 100 in a first embodiment of the present invention. In one embodiment, the integrated circuit package system 100 can be described as an alternative package-on-package configuration, i.e., a three dimensional package in which fully tested packages are stacked on top of other fully tested packages during the board mount process. For purposes of illustration, the integrated circuit package system 100 may generally be used within portable electronics devices that require a high level of functional integration (e.g., memory and/or logic integration), such as a cellphone or a computer.

The cross-sectional view of the integrated circuit package system 100 depicts a base package 102, such as a ball grid array package or a land grid array package, having a base substrate 104 with a base top surface 106 and a base bottom surface 108. A first integrated circuit 110 can be mounted on the base top surface 106 with an layer 112, such as a die attach material with or without thermally conducting capabilities, a spacer, an electromagnetic interference shield for blocking potentially disruptive energy fields, or a combination thereof. In one embodiment, the first integrated circuit 110 can be disposed on a portion (e.g., an area substantially equal to about one-half to about two-thirds) of the base substrate 104, leaving remaining portions of the base substrate 104 available for stacked package electrical interconnections.

By way of example, and not by way of limitation, the first integrated circuit 110 may include one or more semiconductor chips or die that transmit, receive, and/or modulate electrical signals, such as flip-chip die, stacked die, RF die, modular die, ASIC die, memory devices, passive devices or a combination thereof. Furthermore, the first integrated circuit 110 may further include, by way of example and not by way of limitation, one or more integrated circuit packages that transmit, receive, and/or modulate electrical signals, such as leaded and non-leaded packages, internal stacking module packages, flip-chip packages, RF packages, modular packages, application-specific-integrated-circuit (ASIC) packages, memory packages, stacked die packages or a combination thereof. However, it is to be understood that the first integrated circuit 110 covers a wide range of semiconductor chip and integrated circuit package configurations involving various sizes, dimensions, and electrical contact techniques, and the type of chip or package configuration employed should only be limited by the design specifications of the integrated circuit package.

Moreover, it will be appreciated by those skilled in the art that the present embodiments permit the testing of the first integrated circuit 110 before adhering it to the integrated circuit package system 100, thereby ensuring the use of known good die or packages in the manufacturing process. Additionally, after adhering the first integrated circuit 110 to the base substrate 104, this assembly can also be tested before incorporation into additional package systems. This ensures that the final product includes known good assemblies, thereby improving the manufacturing process yield for the integrated circuit package system 100.

The layer 112 can also be formed on a top surface 114 of the first integrated circuit 110 and can be offset from a bond pad 116 by a distance that is currently only limited by the technology of encapsulation equipment. Generally, the layer 112 formed on the top surface 114 can cover about five (5) percent to about ninety-five (95) percent of the first integrated circuit 110. In one embodiment, the bond pad 116 can be located along a periphery of one side of the first integrated circuit 110, for example. In such cases, it will be appreciated by those skilled in the art that locating the bond pad 116 along a periphery of one side of the first integrated circuit 110 can ease the process manufacturing latitude for placing a second package over the base package 102 (e.g., the second package need only be offset from a single formation of the bond pad 116), thereby enabling more products to meet the specified design requirements of the integrated circuit package system 100.

The bond pad 116 of the first integrated circuit 110 can be coupled to the base top surface 106 by an electrical interconnect 118, such as bond wires, for example. It will be appreciated by those skilled in the art that the offset stacking of the integrated circuit package system 100 can also reduce the complexity of the electrical interconnect 118 formation process. By reducing the complexity of the electrical interconnect 118 formation process, the in-line process cycle time for the integrated circuit package system 100 can be improved (i.e., reduced).

A base package body 120, such as a molding compound, can be formed around the bond pad 116, the electrical interconnect 118, a portion of the first integrated circuit 110 adjacent the bond pad 116, and a portion of the base substrate 104. Generally, the base package body 120 covers the portion of the top surface 114 of the first integrated circuit 110 not covered by the layer 112 (e.g., between about five (5) percent to about ninety-five (95) percent of the top surface 114 of the first integrated circuit 110).

The base top surface 106 of the base substrate 104 may also include an array of a contact pad 122 distributed in an area of the base top surface 106 not covered by the first integrated circuit 110 and the base package body 120 (e.g., the remaining area substantially equal to about one-third to about one-half of the base substrate 104). It is to be understood that the contact pad 122 can be configured to provide an area of electrical interconnection between the base package 102 and packages or die formed thereover.

At this stage of manufacture, the integrated circuit package system 100 may also include an offset package 124, such as a flip integrated circuit, positioned over the base package 102. In one embodiment, the offset package 124 can be aligned over the first integrated circuit 110 such that a first portion 126 of the offset package 124 rests over or on the first integrated circuit 110, while a second portion 128 of the offset package 124 overhangs the first integrated circuit 110 and/or the base substrate 104.

The offset package 124 may include a top surface 130 and a bottom surface 132, wherein the bottom surface 132 of the second portion 128 may also include an array of a system interconnect 134 aligned over and corresponding with the contact pad 122, thereby providing an electrical interconnection between the base package 102 and the offset package 124. By way of example, the system interconnect 134 may include structures such as a solder ball, a solder column interposer, or a stud bump.

Additionally, it will be appreciated by those skilled in the art that the overall profile or height of the integrated circuit package system 100 can be controlled or modulated by employing thin and ultra-thin components within the base package 102 and/or the offset package 124.

Figure 2:
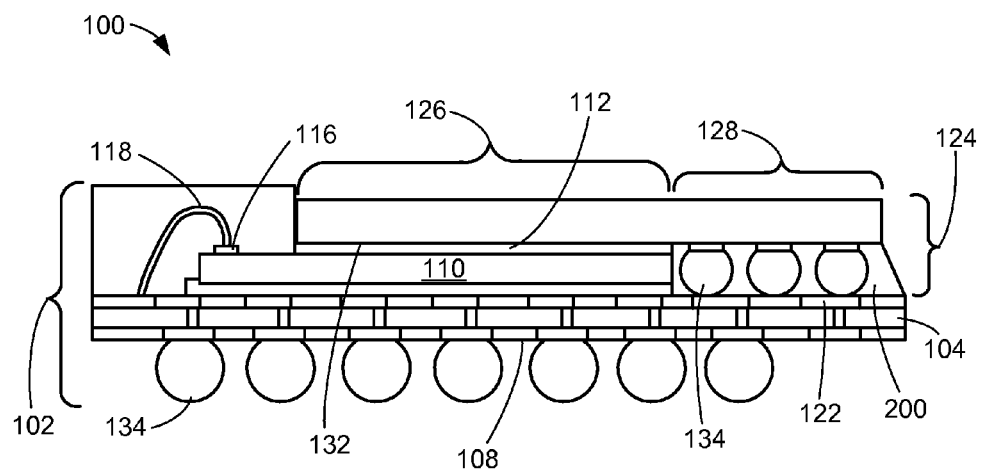
FIG. 2 is a cross-sectional view of a completed form of an integrated circuit package system in accordance with the first embodiment of the present invention.

Referring now to FIG. 2, therein is shown a cross-sectional view of a completed form of the integrated circuit package system 100 in accordance with the first embodiment of the present invention.

Generally, the offset package 124 can be mounted over or on the base package 102 in an offset position with respect to the first integrated circuit 110. It will be appreciated by those skilled in the art that the offset position or distance of the offset package 124 from the bond pad 116 is currently only limited by the technology of encapsulation equipment. In other embodiments, the offset position or distance of the offset package 124 from the bond pad 116 can be limited by the current technology of wire bonding equipment and/or the density of the system interconnect 134 required.

In one embodiment, the bottom surface 132 of the first portion 126 of the offset package 124 can be mounted on the layer 112 of the first integrated circuit 110, while the bottom surface 132 of the second portion 128 of the offset package 124 overhangs the base substrate 104 and rests on the system interconnect 134. As such, the system interconnect 134 formed between the base package 102 and the offset package 124 not only provides an electrical interconnection, but also provides a measurable amount of support to the second portion 128 of the offset package 124 overhanging the base substrate 104. Moreover, an underfill material 200 can be formed between the second portion 128 of the offset package 124 and the base substrate 104 surrounding the system interconnect 134, thereby providing further structural support to the second portion 128 of the offset package 124, while electrically insulating the system interconnect 134.

It will be appreciated by those skilled in the art that this stair stack package configuration provides various three dimensional integration schemes and alternative design structures for package-on-package designs, while maintaining a low profile for the integrated circuit package system 100. For example, by offsetting the offset package 124, the vertical dimension of the integrated circuit package system 100 can be reduced by not requiring the placement of the offset package 124 to accommodate bond wire loop height, thereby helping to maintain a low profile for the integrated circuit package system 100.

Moreover, it will be appreciated by those skilled in the art that the present embodiment reduces the space required for mounting on a printed circuit board (not shown). For example, by not forming the electrical interconnect 118 next to the contact pad 122, the system interconnect 134 between the base package 102 and the offset package 124 can be aligned directly adjacent to the periphery of the first integrated circuit 110, i.e., the system interconnect 134 can be formed in an area traditionally occupied by the electrical interconnect 118, thereby reducing the footprint of the package.

In one embodiment, the system interconnect 134 between the base package 102 and the offset package 124 need only be offset from the first integrated circuit 110 by a distance that is currently only limited by unwanted electrical interference occurrences (e.g., electrical shorts). In such cases, the offset distance may vary with the density of the system interconnect, for example.

It is to be understood that the system interconnect 134, such as a solder ball, solder column interposer or stud bump, may also be formed on the base bottom surface 108 for attachment to the next level of system (not shown).

Figure 3:
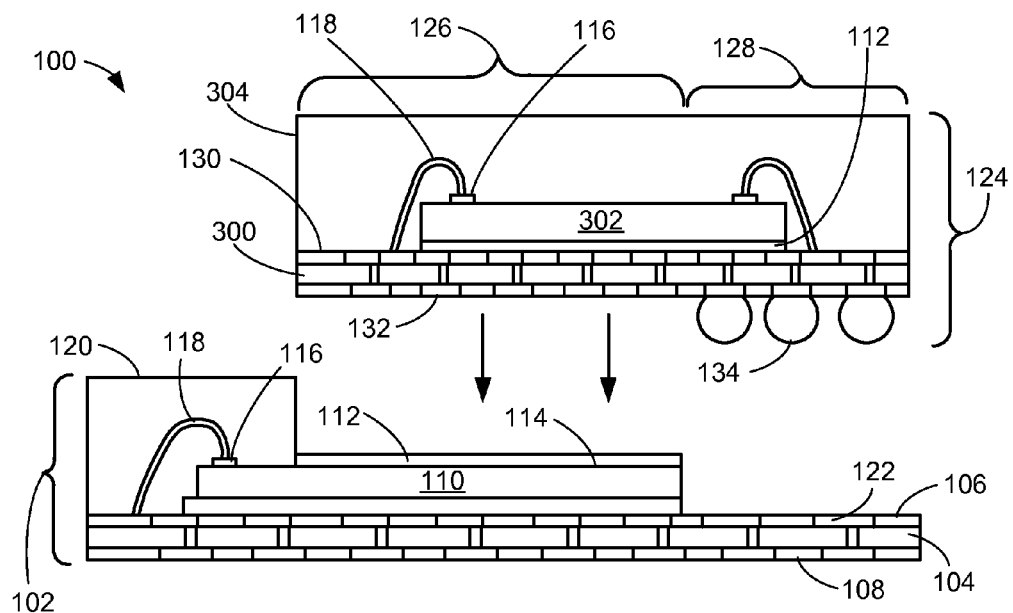
FIG. 3 is a cross-sectional view of components for an integrated circuit package system in a second embodiment of the present invention.
Figure 4:
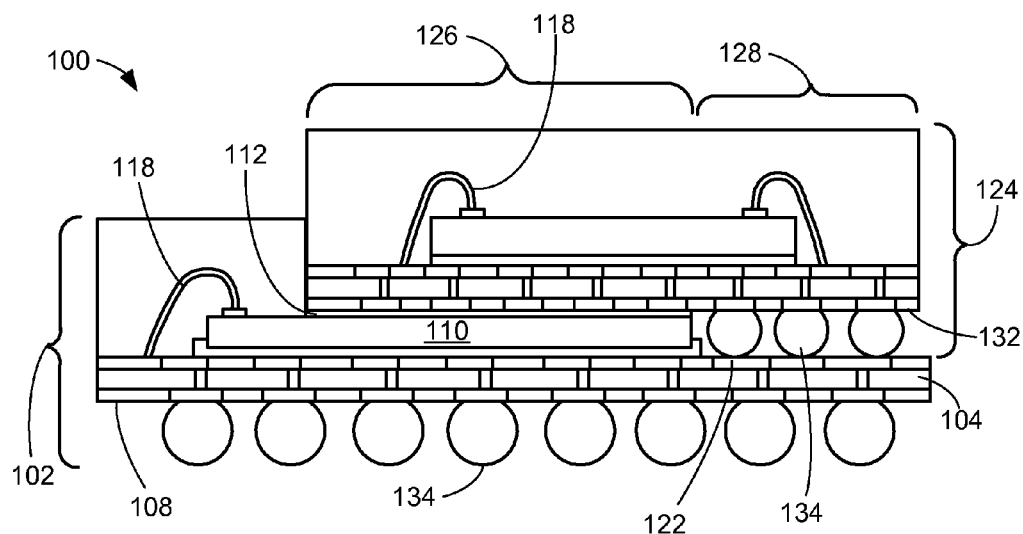
FIG. 4 is a cross-sectional view of a completed form of an integrated circuit package system in accordance with the second embodiment of the present invention.

Referring now to FIGS. 3 and 4, FIGS. 3 and 4 include some of the same reference numbers used to describe the integrated circuit package system 100 in FIGS. 1 and 2 and the process steps of FIGS. 1 and 2. It is noted that the layers, structures, components, and process steps corresponding to such reference numbers generally include the same characteristics (e.g., composition, function, structure, processing techniques, etc.) as those described in reference to FIGS. 1 and 2 and, therefore, their descriptions are not reiterated in detail for FIGS. 3 and 4. Rather the descriptions of the layers, structures, components, and process steps corresponding to reference numbers in FIGS. 1 and 2 are incorporated for the same reference numbers included in FIGS. 3 and 4.

Referring now to FIG. 3, therein is shown a cross-sectional view of components for the integrated circuit package system 100 in a second embodiment of the present invention. In one embodiment, the integrated circuit package system 100 can be described as an alternative package-on-package configuration, i.e., a three dimensional package in which fully tested packages are stacked on top of other fully tested packages during the board mount process.

The integrated circuit package system 100 may include the base package 102, the base substrate 104, the base top surface 106, the base bottom surface 108, the first integrated circuit 110, the layer 112, the top surface 114, the bond pad 116, the electrical interconnect 118, the base package body 120, the contact pad 122, the offset package 124, the first portion 126, the second portion 128, the top surface 130, the bottom surface 132, and the system interconnect 134. It is to be understood that the base package 102, the base substrate 104, the base top surface 106, the base bottom surface 108, the first integrated circuit 110, the layer 112, the top surface 114, the bond pad 116, the electrical interconnect 118, the base package body 120, the contact pad 122, and the system interconnect 134 may include any of the characteristics, such as material composition, structure, functionality, and process techniques, described above in regard to FIGS. 1 and 2.

The integrated circuit package system 100, however, differs from the integrated circuit package system 100 of FIG. 1 by forming the offset package 124, such as a ball grid array package or a land grid array package, to include an offset substrate 300 with a second integrated circuit 302 mounted on the top surface 130 with the layer 112.

By way of example, and not by way of limitation, the second integrated circuit 302 may include one or more semiconductor chips or die that transmit, receive, and/or modulate electrical signals, such as flip-chip die, stacked die, RF die, modular die, ASIC die, memory devices, passive devices or a combination thereof. Furthermore, the second integrated circuit 302 may further include, by way of example and not by way of limitation, integrated circuit packages that transmit, receive, and/or modulate electrical signals, such as leaded and non-leaded packages, internal stacking module packages, flip-chip packages, RF packages, modular packages, application-specific-integrated-circuit (ASIC) packages, memory packages, stacked die packages or a combination thereof. However, it is to be understood that the second integrated circuit 302 covers a wide range of semiconductor chip and integrated circuit package configurations involving various sizes, dimensions, and electrical contact techniques, and the type of chip or package configuration employed should only be limited by the design specifications of the integrated circuit package.

Moreover, it will be appreciated by those skilled in the art that the present embodiments permit the testing of the second integrated circuit 302 before adhering it to the offset package 124, thereby ensuring the use of known good die or packages in the manufacturing process. Additionally, after adhering the second integrated circuit 302 to the offset substrate 300, this assembly can also be tested before incorporation into additional package systems. This ensures that the final product includes known good assemblies, and thereby improves the manufacturing process yield for the package system.

The second integrated circuit 302 can be electrically coupled to the top surface 130 by the electrical interconnect 118. An offset package body 304, such as a molding compound, can be formed over the second integrated circuit 302, the offset substrate 300, and the electrical interconnect 118.

In one embodiment, the offset package 124 can be aligned over the first integrated circuit 110 such that the first portion 126 of the offset package 124 rests over or on the first integrated circuit 110, while the second portion 128 of the offset package 124 overhangs the first integrated circuit 110 and/or the base substrate 104. The bottom surface 132 of the offset substrate 300 may include the system interconnect 134 for electrical interconnection between the offset package 124 and the base package 102.

Referring now to FIG. 4, therein is shown a cross-sectional view of a completed form of the integrated circuit package system 100 in accordance with the second embodiment of the present invention.

Generally, the offset package 124 can be mounted over or on the base package 102 in an offset position with respect to the first integrated circuit 110. In one embodiment, the bottom surface 132 of the first portion 126 of the offset package 124 can be mounted on the layer 112 of the first integrated circuit 110, while the bottom surface 132 of the second portion 128 of the offset package 124 overhangs the base substrate 104 and rests on the system interconnect 134. As such, the system interconnect 134 formed between the base package 102 and the offset package 124 not only provides an electrical interconnection, but also provides a measurable amount of support to the second portion 128 of the offset package 124 overhanging the base substrate 104.

It will be appreciated by those skilled in the art that this stair stack package configuration provides various three dimensional integration schemes and alternative design structures for package-on-package designs, while maintaining a low profile over one or more portions of the integrated circuit package system 100. For example, by offsetting the offset package 124, the vertical dimension of the integrated circuit package system 100 can be reduced by not requiring the placement of the offset package 124 to accommodate bond wire loop height, thereby helping to maintain a low profile for the integrated circuit package system 100.

Moreover, it will be appreciated by those skilled in the art that the present embodiment reduces the space required for mounting on a printed circuit board (not shown). For example, by not forming the electrical interconnect 118 next to the contact pad 122, the system interconnect 134 between the base package 102 and the offset package 124 can be aligned directly adjacent to the periphery of the first integrated circuit 110, i.e., the system interconnect 134 can be formed in an area previously occupied by the electrical interconnect 118, thereby reducing the footprint of the package.

In one embodiment, the system interconnect 134 between the base package 102 and the offset package 124 need only be offset from the first integrated circuit 110 by a distance that is currently only limited by unwanted electrical interference occurrences. (e.g., electrical shorts). In such cases, the offset distance may vary with the density of the system interconnect, for example.

It is also to be understood that the system interconnect 134, such as a solder ball, solder column interposer or stud bump, may also be formed on the base bottom surface 108 for attachment to the next level of system (not shown).

Additionally, depending upon the amount of warpage of the integrated circuit package system 100, an encapsulant can be formed around the system interconnect 134 to help prevent such warpage.

Figure 5:
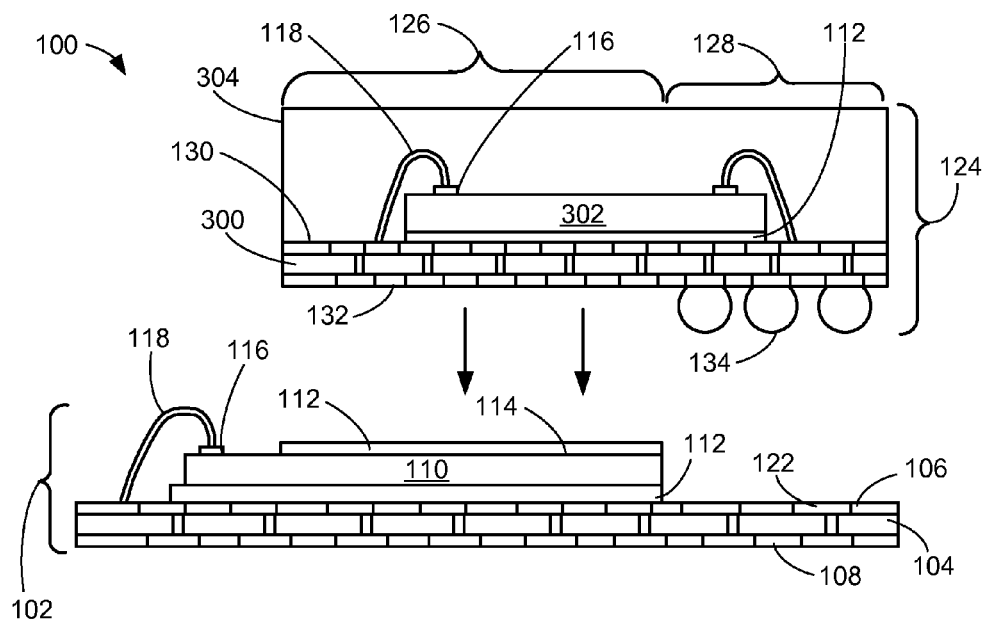
FIG. 5 is a cross-sectional view of components for an integrated circuit package system in a third embodiment of the present invention.

Referring now to FIG. 5, therein is shown a cross-sectional view of components for the integrated circuit package system 100 in a third embodiment of the present invention.

In one embodiment, the integrated circuit package system 100 can be described as an alternative package-in-package configuration, i.e., a three dimensional package that stacks fully tested packages, packaged chips, bare die, and/or internal stacking modules on top of a Base Assembly Package (BAP). Generally, and by way of example, the internal stacking module may include a standard land grid array that can stack multiple memories, while the BAP may include a standard ball grid array with a single Application Specific Integrated Circuit (ASIC) chip or a stack of ASIC and analog integrated circuits or other chips as determined by the application. For purposes of illustration, the integrated circuit package system 100 may generally be used within portable electronics devices that require a high level of functional integration (e.g., memory and/or logic integration), such as a cellphone or computer.

The cross-sectional view of the integrated circuit package system 100 depicts the base package 102, such as a ball grid array package or a land grid array package, having the base substrate 104 with the base top surface 106 and the base bottom surface 108. The first integrated circuit 110 can be mounted on the base top surface 106 with the layer 112, such as a die attach material with or without thermally conducting capabilities, a spacer, an electromagnetic interference shield for blocking potentially disruptive energy fields, or a combination thereof.

By way of example, and not by way of limitation, the first integrated circuit 110 may include one or more semiconductor chips or die that transmit, receive, and/or modulate electrical signals, such as flip-chip die, stacked die, RF die, modular die, ASIC die, memory devices, passive devices or a combination thereof. Furthermore, the first integrated circuit 110 may further include, by way of example and not by way of limitation, one or more integrated circuit packages that transmit, receive, and/or modulate electrical signals, such as leaded and non-leaded packages, internal stacking module packages, flip-chip packages, RF packages, modular packages, application-specific-integrated-circuit (ASIC) packages, memory packages, stacked die packages or a combination thereof. Accordingly, it is to be understood that the first integrated circuit 110 covers a wide range of semiconductor chip and integrated circuit package configurations involving various sizes, dimensions, and electrical contact techniques, and the type of chip or package configuration employed should only be limited by the design specifications of the integrated circuit package.

Moreover, it will be appreciated by those skilled in the art that the present embodiments permit the testing of the first integrated circuit 110 before adhering it to the integrated circuit package system 100, thereby ensuring the use of known good die or packages in the manufacturing process. Additionally, after adhering the first integrated circuit 110 to the base substrate 104, this assembly can also be tested before incorporation into additional package systems. This ensures that the final product includes known good assemblies, and thereby improves the manufacturing process yield for the package system.

The layer 112 can also be formed on the top surface 114 of the first integrated circuit 110 and can be offset from the bond pad 116 by a distance that is currently only limited by the technology of encapsulation equipment. Generally, the layer 112 formed on the top surface 114 can cover about five (5) percent to about ninety-five (95) percent of the first integrated circuit 110. In one embodiment, the bond pad 116 can be located along a periphery of one side of the first integrated circuit 110, for example. It will be appreciated by those skilled in the art that locating the bond pad 116 along a periphery of one side of the first integrated circuit 110 can ease the process manufacturing latitude for placing a second device over the base package 102 (e.g., the second package need only be offset from a single formation of the bond pad 116), thereby enabling more products to meet the specified design requirements of the integrated circuit package system 100.

The bond pad 116 of the first integrated circuit 110 can be coupled to the base top surface 106 by the electrical interconnect 118, such as bond wires, for example. It will be appreciated by those skilled in the art that the offset stacking of the integrated circuit package system 100 can also reduce the complexity of the electrical interconnect 118 formation process. By reducing the complexity of the electrical interconnect 118 formation process, the in-line process cycle time for the integrated circuit package system 100 can be improved (i.e., reduced).

The base top surface 106 of the base substrate 104 may also include an array of the contact pad 122 distributed in an area of the base top surface 106 not covered by the first integrated circuit 110 and on the opposing side of the first integrated circuit 110 with the electrical interconnect 118 (e.g., the remaining area substantially equal to about one-third to about one-half of the base substrate 104). It is to be understood that the contact pad 122 can be configured to form an electrical interconnection between the base package 102 and packages or die formed thereover.

At this stage of manufacture, the integrated circuit package system 100 may also include the offset package 124, such as a ball grid array package or a land grid array package, which may include the offset substrate 300 with the second integrated circuit 302 mounted on the top surface 130 with the layer 112.

By way of example, and not by way of limitation, the second integrated circuit 302 may include one or more semiconductor chips or die that transmit, receive, and/or modulate electrical signals, such as flip-chip die, stacked die, RF die, modular die, ASIC die, memory devices, passive devices or a combination thereof. Furthermore, the second integrated circuit 302 may further include, by way of example and not by way of limitation, one or more integrated circuit packages that transmit, receive, and/or modulate electrical signals, such as leaded and non-leaded packages, internal stacking module packages, flip-chip packages, RF packages, modular packages, application-specific-integrated-circuit (ASIC) packages, memory packages, stacked die packages or a combination thereof. However, it is to be understood that the second integrated circuit 302 covers a wide range of semiconductor chip and integrated circuit package configurations involving various sizes, dimensions, and electrical contact techniques, and the type of chip or package configuration employed should only be limited by the design specifications of the integrated circuit package.

Moreover, it will be appreciated by those skilled in the art that the present embodiments permit the testing of the second integrated circuit 302 before adhering it to the offset package 124, thereby ensuring the use of known good die or packages in the manufacturing process. Additionally, after adhering the second integrated circuit 302 to the offset substrate 300, this assembly can also be tested before incorporation into additional package systems. This ensures that the final product includes known good assemblies, and thereby improves the manufacturing process yield for the package system.

The second integrated circuit 302 can be electrically coupled to the top surface 130 by the electrical interconnect 118. The offset package body 304, such as a molding compound, can be formed over the second integrated circuit 302, the offset substrate 300, and the electrical interconnect 118.

In one embodiment, the offset package 124 can be aligned over the first integrated circuit 110 such that the first portion 126 of the offset package 124 rests over or on the first integrated circuit 110, while the second portion 128 of the offset package 124 overhangs the first integrated circuit 110 and/or the base substrate 104. The bottom surface 132, of the offset substrate 300, may also include the system interconnect 134, which may provide an electrical interconnection between the base package 102 and the offset package 124.

Unlike previous embodiments, the base package 102 of the present embodiment need not possess a molding compound surrounding the electrical interconnect 118 at this stage of manufacture.

Figure 6:
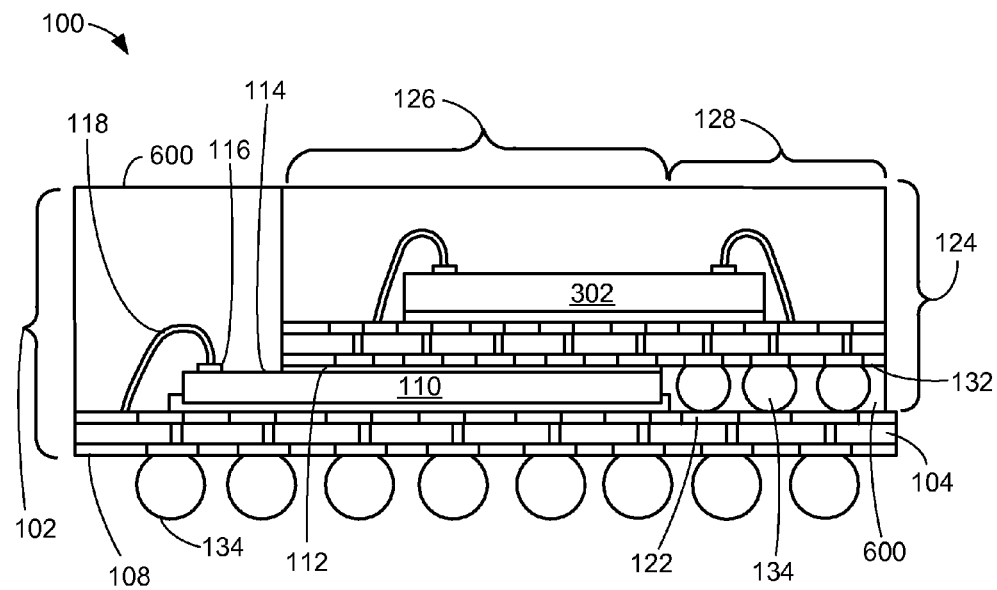
FIG. 6 is a cross-sectional view of a completed form of an integrated circuit package system in accordance with the third embodiment of the present invention.

Referring now to FIG. 6, therein is shown a cross-sectional view of a completed form of the integrated circuit package system 100 in accordance with the third embodiment of the present invention.

Generally, the offset package 124 can be mounted over or on the base package 102 in an offset position with respect to the first integrated circuit 110. It will be appreciated by those skilled in the art that the offset position or distance of the offset package 124 from the bond pad 116 can be currently only limited by the technology of encapsulation equipment. In other embodiments, the offset position or distance of the offset package 124 from the bond pad 116 can be limited by the current technology of wire bonding equipment and/or the density of the system interconnect 134 required.

In one embodiment, the bottom surface 132 of the first portion 126 of the offset package 124 can be mounted on the layer 112 of the first integrated circuit 110, while the bottom surface 132 of the second portion 128 of the offset package 124 overhangs the base substrate 104 and rests on the system interconnect 134. As such, the system interconnect 134 formed between the base package 102 and the offset package 124 not only provides an electrical interconnection, but also provides a measurable amount of support to the second portion 128 of the offset package 124 overhanging the base substrate 104. Moreover, a system package body 600, such as a molding compound, can be formed between the second portion 128 of the offset package 124 and the base substrate 104 surrounding the system interconnect 134, thereby providing further structural support to the second portion 128 of the offset package 124, while electrically insulating the system interconnect 134.

It will be appreciated by those skilled in the art that this stair stack package configuration provides various three dimensional integration schemes and alternative design structures for package-on-package designs, while maintaining a low profile for the integrated circuit package system 100. For example, by offsetting the offset package 124, the vertical dimension of the integrated circuit package system 100 can be reduced by not requiring the placement of the offset package 124 to accommodate bond wire loop height, thereby helping to maintain a low profile for the integrated circuit package system 100.

Moreover, it will be appreciated by those skilled in the art that the present embodiment reduces the space required for mounting on a printed circuit board (not shown). For example, by not forming the electrical interconnect 118 next to the contact pad 122, the system interconnect 134 between the base package 102 and the offset package 124 can be aligned directly adjacent to the periphery of the first integrated circuit 110, i.e., the system interconnect 134 can be formed in an area traditionally occupied by the electrical interconnect 118, thereby reducing the footprint of the package.

In one embodiment, the system interconnect 134 between the base package 102 and the offset package 124 need only be offset from the first integrated circuit 110 by a distance that is currently only limited by unwanted electrical interference occurrences (e.g., electrical shorts). In such cases, the offset distance may vary with the density of the system interconnect, for example.

The system package body 600 can also be formed around the bond pad 116, the electrical interconnect 118, a portion of the first integrated circuit 110 adjacent the bond pad 116, and a portion of the base substrate 104. Generally, the system package body 600 covers the portion of the top surface 114 of the first integrated circuit 110 not covered by the layer 112 (e.g., between about five (5) percent to about ninety-five (95)

percent of the top surface 114 of the first integrated circuit 110) and the remaining portions of the base substrate 104 left exposed. In one embodiment, the electrical interconnect 118 and the system interconnect 134 between the base package 102 and the offset package 124 are encapsulated at approximately the same time by the system package body 600.

It is to be understood that the system interconnect 134, such as a solder ball, solder column interposer or stud bump, may also be formed on the base bottom surface 108 for attachment to the next level of system (not shown).

Figure 7:
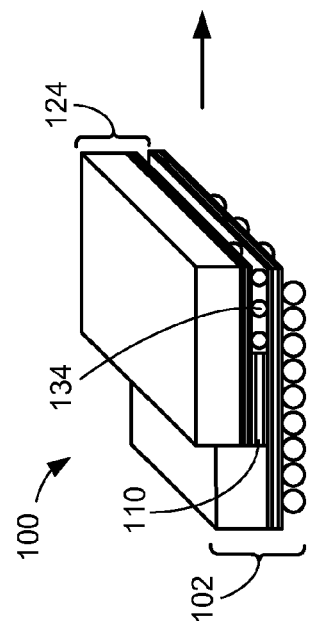
FIG. 7 is a cross-sectional view of components for an integrated circuit package system in accordance with the second embodiment of the present invention depicted in FIG. 3.

Referring now to FIG. 7, therein is shown a cross-sectional view of components for the integrated circuit package system 100 in accordance with the second embodiment of the present invention depicted in FIG. 3. The integrated circuit package system 100 may generally be referred to as an alternative package-on-package structure.

Figure 8:
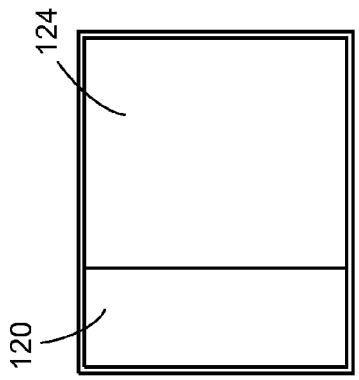
FIG. 8 is an isometric view of an integrated circuit package system, in accordance with an embodiment of the second embodiment of the present invention.

Referring now to FIG. 8, therein is shown an isometric view of the integrated circuit package system 100, in accordance with an embodiment of the second embodiment of the present invention.

Per this embodiment, it can be seen that the offset package 124 may be offset stacked over the base package 102, thereby providing a package system with a low profile over a portion of the integrated circuit package system 100. Additionally, the present embodiment also depicts how the system interconnect 134 between the offset package 124 and the base package 102 may be formed directly adjacent the first integrated circuit 110 due to the absence of any wire bond electrical interconnections between the first integrated circuit 110 and the base substrate 104.

Figure 9:
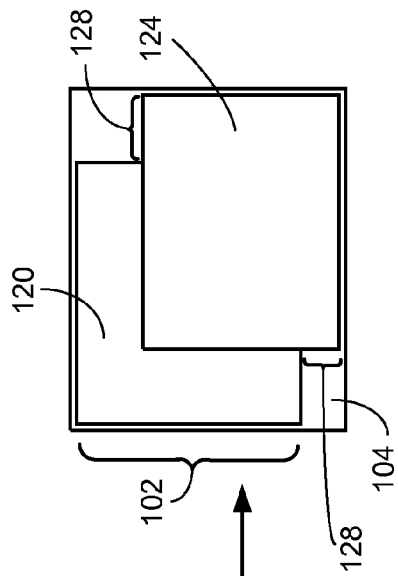
FIG. 9 is a top view of FIG. 8.

Referring now to FIG. 9, therein is shown a top view of FIG. 8.

Per this embodiment, it can be seen that the first integrated circuit 110 (not shown) and the offset package 124 may substantially cover the entirety of the base substrate 104 (not shown). Additionally, this perspective depicts how, in one embodiment, the offset package 124 can be aligned with one edge of the base package body 120.

Figure 10:
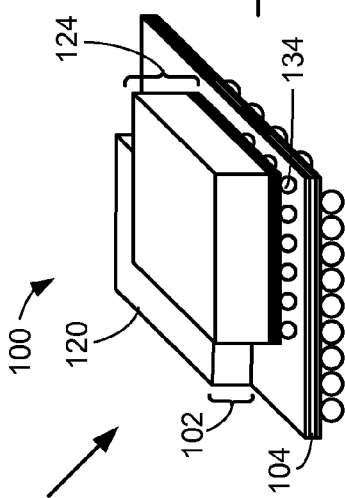
FIG. 10 is an isometric view of an integrated circuit package system in accordance with an alternate embodiment of the second embodiment of the present invention.

Referring now to FIG. 10, therein is shown an isometric view of the integrated circuit package system 100, in accordance with an alternate embodiment of the second embodiment of the present invention.

Per this embodiment, it can be seen that the offset package 124 may be offset stacked over the base package 102, thereby providing a package system with a low profile over a portion of the integrated circuit package system 100. Additionally, the present embodiment depicts how the electrical interconnect 118 (not shown, but encased by the base package body 120) can be formed around one or more sides of the first integrated circuit 110 (not shown). Further, the present embodiment also depicts how the offset package 124 may be positioned over the first integrated circuit 110 to overhang one or more sides of the first integrated circuit 110. Moreover, the present embodiment also depicts how the system interconnect 134 between the offset package 124 and the base package 102 may be formed around one or more sides of the first integrated circuit 110.

It will be appreciated by those skilled in the art that the exposed portions of the base substrate 104 may remain open or may include additional active and/or passive device structures.

Figure 11:
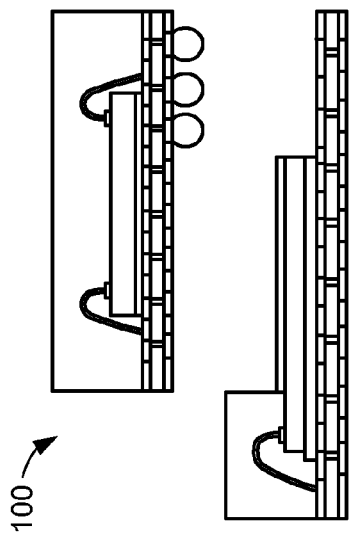
FIG. 11 is a top view of FIG. 10.

Referring now to FIG. 11, therein is shown a top view of FIG. 10.

Per this embodiment, it can be seen that the offset package 124 can be positioned over the first integrated circuit 110 (not shown) such that the second portion 128 overhangs one or more sides of the first integrated circuit 110. Additionally, this perspective of the integrated circuit package system 100 depicts how the length and width dimensions of the first integrated circuit 110 and/or the offset package 124 can be smaller than the length and width dimensions of the base substrate 104, thereby exposing portions of the base substrate 104 suitable for additional active and/or passive device structures. For purposes of illustration, the base package 102 may be formed on one corner of the base substrate 104 and the offset package 124 may be formed over another corner of the base substrate 104.

In one embodiment, the offset package 124 can be aligned with one or more edges of the base package body 120.

Referring now to FIG. 12, therein is shown a cross-sectional view of components for the integrated circuit package system 100 in accordance with the third embodiment of the present invention depicted in FIG. 5. The integrated circuit package system 100 may generally be referred to as an alternative package-in-package structure.

Referring now to FIG. 13, therein is shown an isometric view of the integrated circuit package system 100 in accordance with an embodiment of the third embodiment of the present invention.

Per this embodiment, it can be seen that the offset package 124 may be offset stacked over the base package 102, thereby forming a stair stacked type configuration. Additionally, the present embodiment also depicts how the system interconnect 134 between the offset package 124 and the base package 102 may be formed directly adjacent the first integrated circuit 110 due to the absence of any wire bond electrical interconnections between the first integrated circuit 110 and the base substrate 104.

Referring now to FIG. 14, therein is shown an isometric view of FIG. 13 after encapsulation.

Per this embodiment, it can be seen that the first integrated circuit 110 (not shown), portions of which are covered by the system package body 600, and the offset package 124 may substantially cover the entirety of the base substrate 104. The offset package 124 can be encapsulated on one or more sides by the system package body 600 to form a package-in-package structure. For example, the bottom surface 132 of the offset package 124 and one of the four vertical sidewalls of the offset package can be encapsulated by the system package body 600, thereby completely encapsulating the base substrate 104, the first integrated circuit 110, the electrical interconnects 118 (not shown), and the system interconnect 134 (not shown) between the base substrate 104 and the offset substrate 300.

Referring now to FIG. 15, therein is shown an isometric view of the integrated circuit package system 100 in accordance with an alternate embodiment of the third embodiment of the present invention.

Per this embodiment, it can be seen that the offset package 124 may be offset stacked over the first integrated circuit 110, thereby forming a stair stacked type configuration. Additionally, the present embodiment also depicts how the offset package 124 may be positioned over the first integrated circuit 110 such that the second portion 128 overhangs one or more sides of the first integrated circuit 110. Furthermore, the present embodiment also depicts how the system interconnect 134 between the offset package 124 and the base substrate 104 may be formed around one or more sides of the first integrated circuit 110.

Moreover, it is to be understood that the offset configuration of the present embodiment permits the electrical interconnect 118 to be formed around one or more sides of the first integrated circuit 110.

Additionally, this perspective of the integrated circuit package system 100 depicts how the length and width dimensions of the first integrated circuit 110 and/or the offset package 124 can be smaller than the length and width dimensions of the base substrate 104, thereby exposing portions of the base substrate 104. It will be appreciated by those skilled in the art that the exposed portions of the base substrate 104 may remain open or may include additional active and/or passive device structures.

Referring now to FIG. 16, therein is shown an isometric view of FIG. 15 after encapsulation.

In one embodiment, the base package 102 may be formed on one corner of the base substrate 104 and the offset package 124 may be formed over another corner of the base substrate 104. In such cases, the offset package 124 can be encapsulated on one or more sides by the system package body 600. For example, the bottom surface 132 of the offset package 124 and two of the four vertical sidewalls of the offset package can be encapsulated by the system package body 600, thereby encapsulating the base substrate 104, the first integrated circuit 110 (not shown), the electrical interconnect 118 (not shown), and the system interconnect 134 (not shown) between the base substrate 104 and the offset substrate 300.

Figure 17:
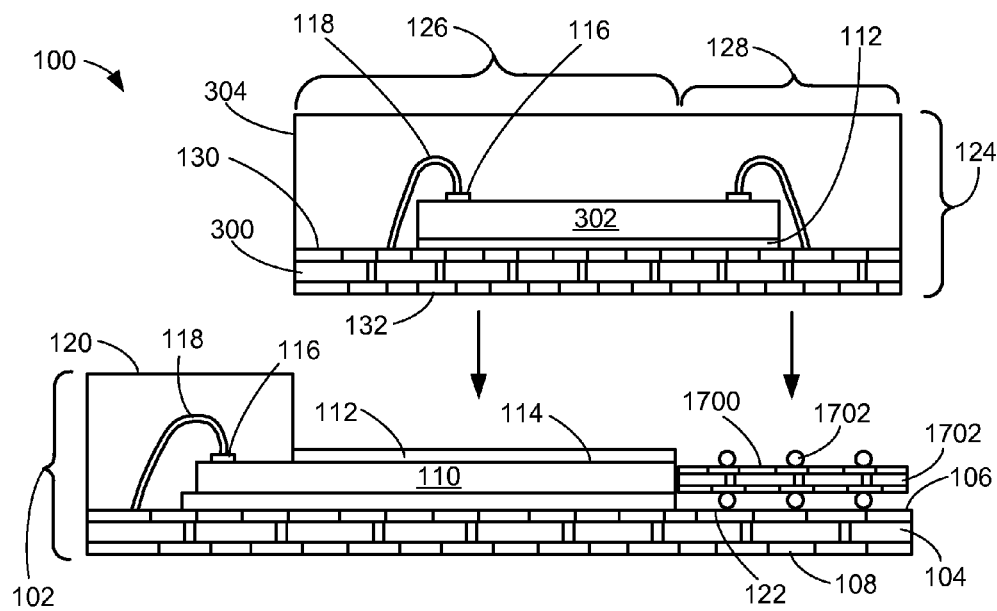
FIG. 17 is a cross-sectional view of components for an integrated circuit package system in a fourth embodiment of the present invention.
Figure 18:
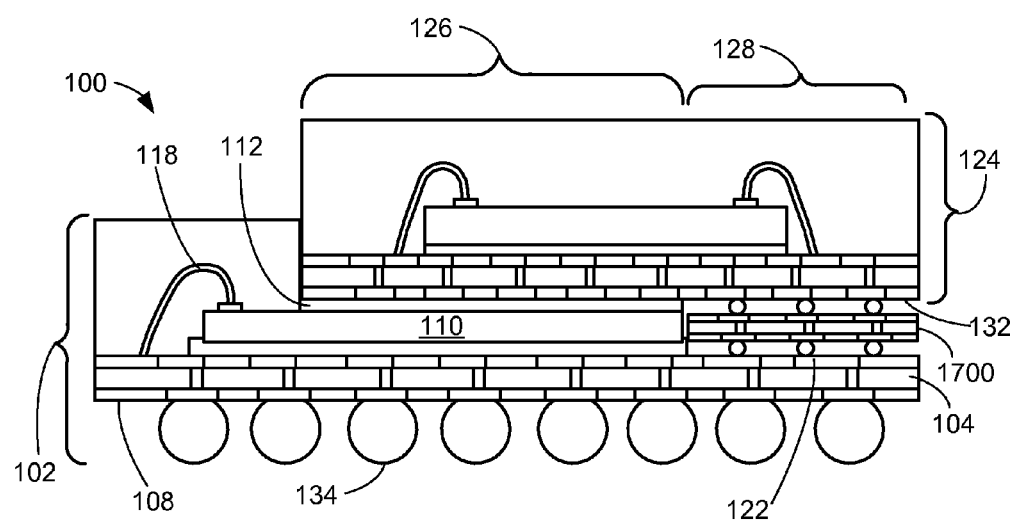
FIG. 18 is a cross-sectional view of a completed form of an integrated circuit package system in accordance with the fourth embodiment of the present invention.

Referring now to FIGS. 17 and 18. FIGS. 17 and 18 include some of the same reference numbers used to describe the integrated circuit package system 100 in FIGS. 3 and 4 and the process steps of FIGS. 3 and 4. It is noted that the layers, structures, components, and process steps corresponding to such reference numbers generally include the same characteristics (e.g., composition, function, structure, processing techniques, etc.) as those described in reference to FIGS. 3 and 4 and, therefore, their descriptions are not reiterated in detail for FIGS. 17 and 18. Rather the descriptions of the layers, structures, components, and process steps corresponding to reference numbers in FIGS. 3 and 4 are incorporated for the same reference numbers included in FIGS. 17 and 18.

Referring now to FIG. 17, therein is shown a cross-sectional view of components for the integrated circuit package system 100 in a fourth embodiment of the present invention. In one embodiment, the integrated circuit package system 100 can be described as an alternative package-on-package configuration.

The integrated circuit package system 100 may include the base package 102, the base substrate 104, the base top surface 106, the base bottom surface 108, the first integrated circuit 110, the layer 112, the top surface 114, the bond pad 116, the electrical interconnect 118, the base package body 120, the contact pad 122, the offset package 124, the first portion 126, the second portion 128, the top surface 130, the bottom surface 132, the offset substrate 300, the second integrated circuit 302, and the offset package body 304. It is to be understood that the base package 102, the base substrate 104, the base top surface 106, the base bottom surface 108, the first integrated circuit 110, the layer 112, the top surface 114, the bond pad 116, the electrical interconnect 118, the base package body 120, the contact pad 122, the offset package 124, the first portion 126, the second portion 128, the top surface 130, the bottom surface 132, the offset substrate 300, the second integrated circuit 302, and the offset package body 304 may include any of the characteristics, such as material composition, structure, functionality, and process techniques, described above in regard to FIGS. 3 and 4.

The integrated circuit package system 100, however, differs from the integrated circuit package system 100 of FIG. 3 by forming a system interconnect 1700, such as an interposer or an interface, between the offset substrate 300 and the base substrate 104 instead of the system interconnect 134 of FIGS. 3 and 4. In one embodiment, the system interconnect 1700 may include a substrate 1702 and one or more of an electrical contact 1704, such as a solder ball, a solder column, or a stud bump, formed on opposing surfaces of the substrate 1702. It will be appreciated by those skilled in the art that the system interconnect 1700 can be designed to improve the structural integrity and heat dissipation of the integrated circuit package system 100, while also improving the reliability of the electrical connection between the base package 102 and the offset package 124 by reducing the height of a solder ball interconnect.

Generally, the offset package 124 can be aligned over the first integrated circuit 110 such that the first portion 126 of the offset package 124 rests over or on the first integrated circuit 110, while the second portion 128 of the offset package 124 overhangs the first integrated circuit 110 and/or the base substrate 104 and is supported and electrically coupled to the base package 102 by the system interconnect 1700.

Referring now to FIG. 18, therein is shown a cross-sectional view of a completed form of the integrated circuit package system 100, in accordance with the fourth embodiment of the present invention.

Generally, the offset package 124 can be mounted over or on the base package 102 in an offset position with respect to the first integrated circuit 110. In one embodiment, the bottom surface 132 of the first portion 126 of the offset package 124 can be mounted on the layer 112 of the first integrated circuit 110, while the bottom surface 132 of the second portion 128 of the offset package 124 overhangs the base substrate 104 and rests on the system interconnect 1700. As such, the system interconnect 1700 formed between the base package 102 and the offset package 124 not only provides an electrical interconnection, but also provides a measurable amount of support to the second portion 128 of the offset package 124 overhanging the base substrate 104.

It will be appreciated by those skilled in the art that this stair stack package configuration provides various three dimensional integration schemes and alternative design structures for package-on-package designs, while maintaining a low profile over the integrated circuit package system 100. Moreover, it will be appreciated by those skilled in the art that the present embodiment reduces the space required for mounting on a printed circuit board (not shown). For example, by not forming the electrical interconnect 118 next to the contact pad 122, the system interconnect 1700 between the base package 102 and the offset package 124 can be aligned directly adjacent to the periphery of the first integrated circuit 110, i.e., the system interconnect 1700 can be formed in an area traditionally occupied by the electrical interconnect 118, thereby reducing the footprint of the package. Depending upon design specifications, the system interconnect 1700 can be encapsulated or unencapsulated.

It is also to be understood that the system interconnect 134 may also be formed on the base bottom surface 108 for attachment to the next level of system (not shown).

Figure 19:
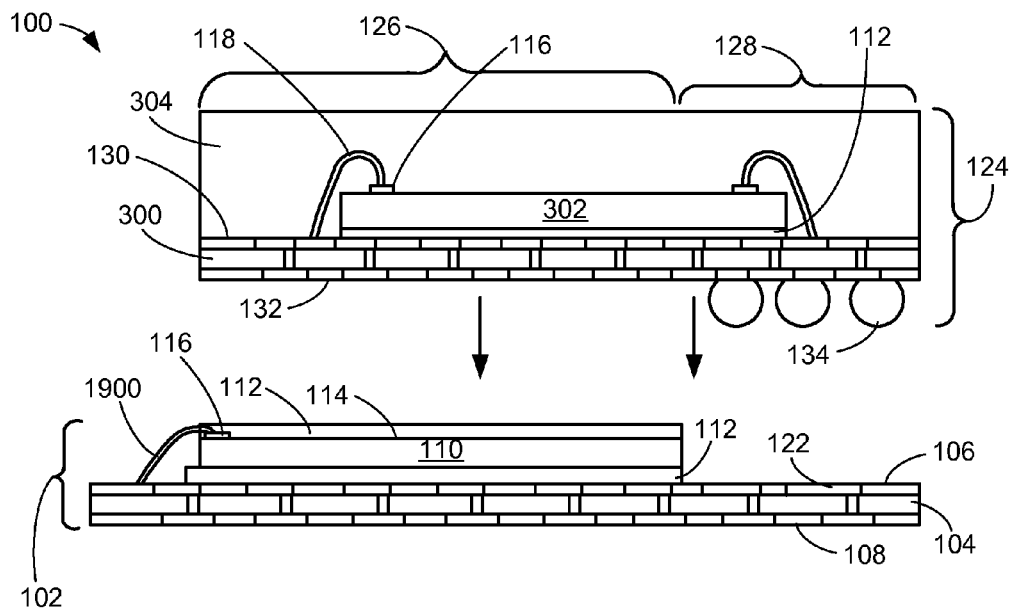
FIG. 19 is a cross-sectional view of components for an integrated circuit package system in a fifth embodiment of the present invention.
Figure 20:
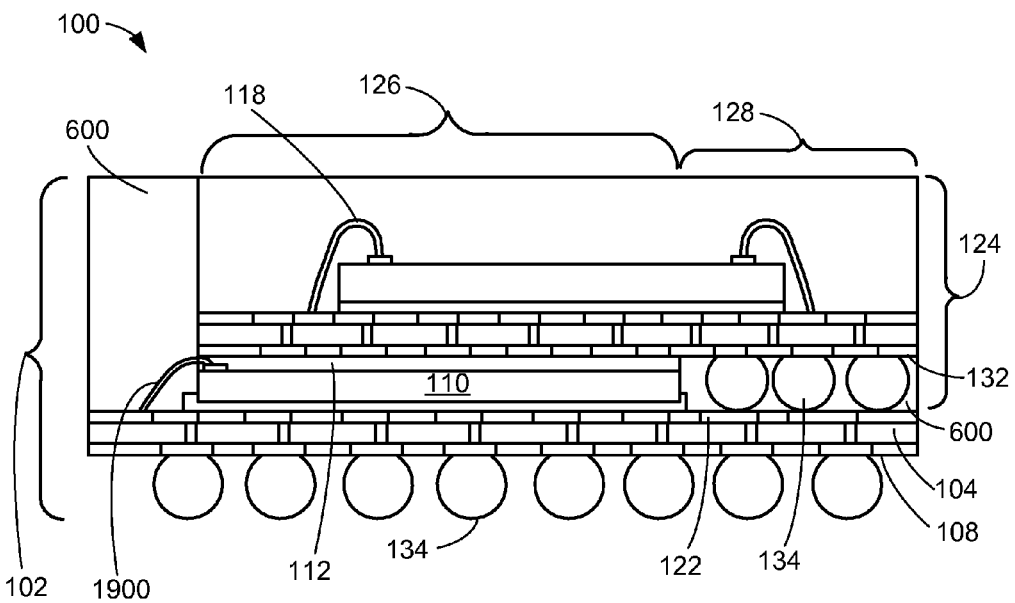
FIG. 20 is a cross-sectional view of a completed form of an integrated circuit package system in accordance with the fifth embodiment of the present invention.

Referring now to FIGS. 19 and 20, FIGS. 19 and 20 include some of the same reference numbers used to describe the integrated circuit package system 100 in FIGS. 5 and 6 and the process steps of FIGS. 5 and 6. It is noted that the layers, structures, components, and process steps corresponding to such reference numbers generally include the same characteristics (e.g., composition, function, structure, processing techniques, etc.) as those described in reference to FIGS. 5 and 6 and, therefore, their descriptions are not reiterated in detail for FIGS. 19 and 20. Rather the descriptions of the layers, structures, components, and process steps corresponding to reference numbers in FIGS. 5 and 6 are incorporated for the same reference numbers included in FIGS. 19 and 20.

Referring now to FIG. 19, therein is shown a cross-sectional view of components for the integrated circuit package system 100 in a fifth embodiment of the present invention. In one embodiment, the integrated circuit package system 100 can be described as an alternative package-in-package configuration.

The integrated circuit package system 100 may include the base package 102, the base substrate 104, the base top surface 106, the base bottom surface 108, the first integrated circuit 110, the layer 112, the top surface 114, the bond pad 116, the electrical interconnect 118, the contact pad 122, the offset package 124, the first portion 126, the second portion 128, the top surface 130, the bottom surface 132, the system interconnect 134, the offset substrate 300, the second integrated circuit 302, and the offset package body 304. It is to be understood that the base package 102, the base substrate 104, the base top surface 106, the base bottom surface 108, the first integrated circuit 110, the layer 112, the top surface 114, the bond pad 116, the electrical interconnect 118, the contact pad 122, the offset package 124, the first portion 126, the second portion 128, the top surface 130, the bottom surface 132, the system interconnect 134, the offset substrate 300, the second integrated circuit 302, and the offset package body 304 may include any of the characteristics, such as material composition, structure, functionality, and process techniques, described above in regard to FIGS. 5 and 6.

The integrated circuit package system 100, however, differs from the integrated circuit package system 100 of FIG. 5 by forming an electrical interconnect 1900, such as a lead-in-film structure, to electrically couple the first integrated circuit 110 to the base substrate 104. Generally, the electrical interconnect 1900 can be described as a wire bond partially encapsulated in a material, such as the layer 112, formed between dies, integrated circuits, substrates, and/or packages, for example.

At this stage of manufacture, the offset package 124 can be aligned over the first integrated circuit 110 such that the first portion 126 of the offset package 124 rests over or on the first integrated circuit 110, while the second portion 128 of the offset package 124 overhangs the first integrated circuit 110 and/or the base substrate 104 and is supported and electrically coupled to the base package 102 by the system interconnect 134.

Referring now to FIG. 20, therein is shown a cross-sectional view of a completed form of the integrated circuit package system 100, in accordance with the fifth embodiment of the present invention.

Generally, the offset package 124 can be mounted over or on the base package 102 in an offset position with respect to the first integrated circuit 110. In one embodiment, the bottom surface 132 of the first portion 126 of the offset package 124 can be mounted on the layer 112 of the first integrated circuit 110, while the bottom surface 132 of the second portion 128 of the offset package 124 overhangs the base substrate 104 and rests on the system interconnect 134. As such, the system interconnect 134 formed between the base package 102 and the offset package 124 not only provides an electrical interconnection, but also provides a measurable amount of support to the second portion 128 of the offset package 124 overhanging the base substrate 104.

Moreover, the system package body 600, such as a molding compound, can be formed between the second portion 128 of the offset package 124 and the base substrate 104 surrounding the system interconnect 134, thereby providing further structural support to the second portion 128 of the offset package 124, while electrically insulating the system interconnect 134. The system package body 600 can also be formed around a portion of the electrical interconnect 1900 and a portion of the base substrate 104. In one embodiment, the electrical interconnect 1900 and the system interconnect 134 between the base package 102 and the offset package 124 are encapsulated at approximately the same time by the system package body 600.

It will be appreciated by those skilled in the art that this stair stack package configuration provides various three dimensional integration schemes and alternative design structures for package-on-package designs, while maintaining a low profile for the integrated circuit package system 100. Moreover, it will be appreciated by those skilled in the art that the present embodiment reduces the space required for mounting on a printed circuit board (not shown). For example, by not forming the electrical interconnect 1900 next to the contact pad 122, the system interconnect 134 between the base package 102 and the offset package 124 can be aligned directly adjacent to the periphery of the first integrated circuit 110, i.e., the system interconnect 134 can be formed in an area traditionally occupied by the electrical interconnect 118 or 1900, thereby reducing the footprint of the package.

It is to be understood that the system interconnect 134 may also be formed on the base bottom surface 108 for attachment to the next level of system (not shown).

In the embodiments shown in FIGS. 1-20, the electrical interconnect 118 and 1900 are connected to active sides of the first integrated circuit 110 and the second integrated circuit 302. However, it is to be understood that the depiction of wire bonds and/or lead-in-film for the electrical interconnect 118 and 1900 does not exclude the use of conductive balls for mounting the first integrated circuit 110 and/or the second integrated circuit 302 to its respective substrate. Moreover, it is to be understood that the depiction of wire bonds and/or lead-in-film for the electrical interconnect 118 and 1900 does not exclude the use of conductive balls between the first integrated circuit 110 and/or the second integrated circuit 302, where the first integrated circuit 110 and the second integrated circuit 302 may have facing active faces because of the use of flip integrated circuit dies.

Figure 21:
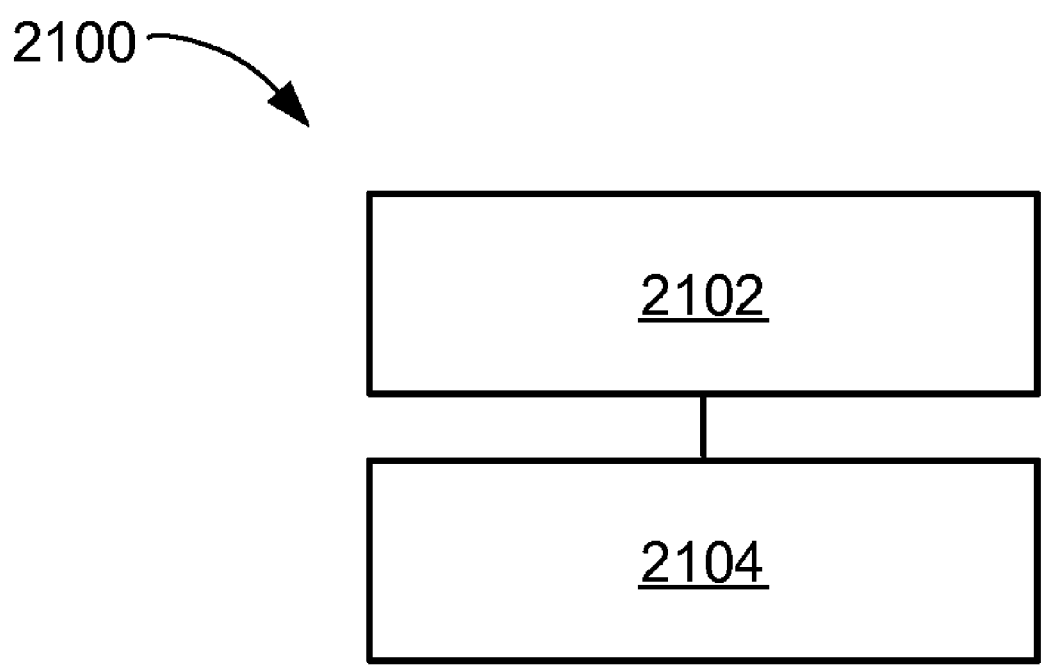
FIG. 21 is a flow chart of a method for manufacturing an integrated circuit system in accordance with an embodiment of the present invention.

Referring now to FIG. 21, therein is shown a flow chart of a method for manufacturing an integrated circuit system 2100 for the integrated circuit package system 100 in accordance with an embodiment of the present invention. The integrated circuit system 2100 includes providing a base package including a first integrated circuit coupled to a base substrate by an electrical interconnection formed on one side in a block 2102; and mounting an offset package over the base package, the offset package electrically coupled to the base substrate via a system interconnect in a block 2104.

It has been discovered that the present invention thus has numerous aspects. One such aspect is that the present invention increases the functional integration of a package system by stair stacking individual components one over the other in an offset fashion.

Another aspect is that the present invention enables various three dimensional integration schemes and design structures, thereby enabling alternative package-on-package and alternative package-in-package designs.

Another aspect is that the present invention enables various three dimensional integration schemes and design structures with reduced package profiles due to offset stacking of packages.

Another aspect is that the present invention enables various three dimensional integration schemes and design structures with a reduced footprint area due to strategically engineered and designed electrical interconnects and system interconnects.

Another aspect is that the present invention enables various three dimensional integration schemes and design structures, which provide significant flexibility in selecting the packages to be stacked, and, therefore in the kinds of functions that can be integrated.

Another aspect is that the present invention enables the use of known good components, thereby improving the manufacturing process yield for the integrated circuit package system.

Yet another important aspect of the present invention is that it valuably supports and services the historical trend of reducing costs, simplifying systems, and increasing performance.

These and other valuable aspects of the present invention consequently further the state of the technology to at least the next level.

Thus, it has been discovered that the integrated circuit package system of the present invention furnishes important and heretofore unknown and unavailable solutions, capabilities, and functional aspects for providing various three-dimensional package integration schemes, for increasing the level of functional integration, and/or for decreasing the package footprint and profile. The resulting processes and configurations are straightforward, cost-effective, uncomplicated, highly versatile and effective, can be implemented by adapting known technologies, and are thus readily suited for efficiently and economically manufacturing integrated circuit package devices.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations, which fall within the scope of the included claims. All matters hithertofore set forth herein or shown in the accompanying drawings are to be interpreted in an illustrative and non-limiting sense.

What is claimed is:

1. A method for manufacturing an integrated circuit package system comprising:
    providing a base package including a first integrated circuit coupled to a base substrate by an electrical interconnect formed on one side; and
    mounting an offset package over the base package, the offset package electrically coupled to the base substrate via a system interconnect and including a flip integrated circuit or a flip chip component.

2. The method as claimed in claim 1 wherein:
    mounting the offset package includes forming a first portion over the first integrated circuit and a second portion overhanging the base substrate.

3. A method for manufacturing an integrated circuit package system comprising:
    providing a base package including a first integrated circuit coupled to a base substrate by an electrical interconnect formed on one side; and
    mounting a first portion of an offset package over the first integrated circuit and a second portion of the offset package overhanging the base substrate, the second portion coupled to the base substrate and the offset package including a flip integrated circuit or a flip chip component.

4. The method as claimed in claim 3 wherein:
    providing the first integrated circuit coupled to the base substrate by an electrical interconnect formed on one side includes utilizing lead-in-film structures.

5. The method as claimed in claim 3 wherein:
    coupling the second portion to the base substrate includes using an interposer as a system interconnect.

6. The method as claimed in claim 3 wherein:
    mounting the offset package includes positioning the offset package to overhang one or more sides of the first integrated circuit.

7. The method as claimed in claim 3 further comprising:
    mounting a passive component, an active component, or a combination thereof on the base substrate.

8. An integrated circuit package system comprising:
    a base package including a first integrated circuit coupled to a base substrate by an electrical interconnect on one side; and
    an offset package over the base package, the offset package electrically coupled to the base substrate via a system interconnect and including a flip integrated circuit or a flip chip component.

9. The system as claimed in claim 8 further comprising:
    a base package body over the electrical interconnect and a portion of the first integrated circuit and the base substrate.

10. The system as claimed in claim 8 further comprising:
    a system package body over the electrical interconnect and around a portion of the offset package.

11. The system as claimed in claim 8 wherein:
    the offset package includes a first portion on the first integrated circuit and a second portion overhanging the base substrate.

12. The system as claimed in claim 8 wherein:
    the system interconnect includes a solder ball structure.

13. The system as claimed in claim 8 wherein:
    the electrical interconnect includes a lead-in-film structure.

14. The system as claimed in claim 8 wherein:
    the system interconnect includes an interposer.

15. The system as claimed in claim 8 further comprising:
    a passive component, an active component, or a combination thereof on the base substrate.

* * * * *